RICHARD C. MACKEY
INVENTOR.

BY [signature]
AGENT

RICHARD C. MACKEY
INVENTOR.

BY [signature]
AGENT

RICHARD C. MACKEY
INVENTOR.

BY [signature]
AGENT

3,304,518
INJECTION LOCKED OSCILLATOR HAVING PHASE MODULATION MEANS

Richard C. Mackey, Reseda, Calif., assignor, by mesne assignments, to TRW Inc., a corporation of Ohio
Filed July 1, 1963, Ser. No. 291,875
6 Claims. (Cl. 332—19)

This invention relates to oscillator synchronization phenomena and more particularly to the locking of oscillators in the microwave region of the frequency spectrum. Within certain bounds, a microwave oscillator may be synchronized by the injection of a controlling signal into the oscillator cavity. Synchronization is then dependent upon oscillator circuit parameters, the ratio of injected power to oscillator power, and frequency difference between the free-running oscillator and the injection locking signal.

It is well known in the electronic art that amplifying devices are useful as oscillators at frequencies considerably in excess of their highest useful frequency of amplification. Stated another way, oscillators have appeared considerably in advance of amplifier devices. The synchronization of an oscillator by a signal that is a few orders of magnitude below the oscillator power output may be considered as a form of amplification. At microwave frequencies, considerably more oscillator devices than amplifier devices are available in any frequency band. Furthermore, oscillator devices tend to be smaller, lighter and electrically more efficient than amplifier devices and, in particular, microwave oscillators are considerably less expensive than amplifiers.

The present invention is concerned with the locking phenomena of oscillators for obtaining amplification by synchronization of an oscillator with a locking signal to thereby obtain an amplified output signal at the frequency of the locking signal.

In this invention a klystron oscillator or backward wave oscillator, for example, is locked to an impressed reference signal by introducing a portion of the signal into the oscillator circuit by means of a circulator. The circulator contains a plurality of ports measured serially in the direction of energy propagated within the circulator. A four port circulator having an externally matched load or a three port circulator having an internally matched load may be used. The reference signal is directed into a first port and the oscillator circuit is connected to a second port. A utilization circuit connected to the third port then receives an oscillator generated signal at the reference signal frequency. In most microwave oscillators the passive circuitry is entirely within a vacuum envelope and only a single RF port is available for removing energy from the tube, thus making isolation of the locking reference signal from the oscillator very difficult if not impossible.

The present disclosed combination of a one port oscillator and a circulator makes possible a separation of the locking and output signals in which the circulator effectively makes a two port device out of a one port oscillator.

Further objects and advantages of the invention will be made more apparent by referring now to the accompanying drawings wherein.

Figure 1:
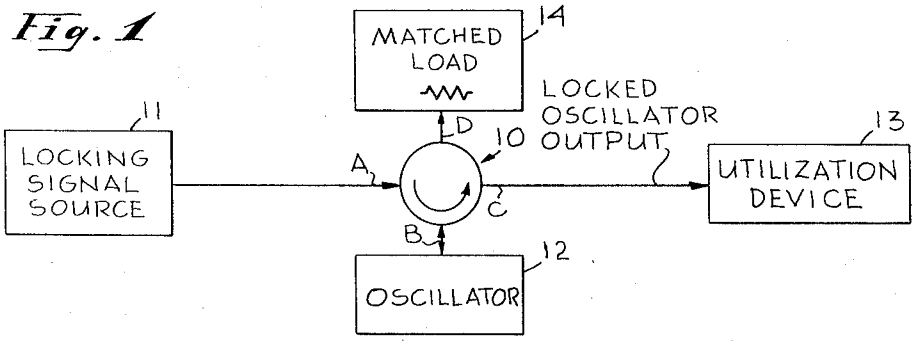
FIG. 1 illustrates the basic oscillator circulator combination.

Referring now to FIG. 1 there is shown, a four port circulator 10 having ports A, B, C and D measured serially in the direction of energy propagation within the circulator. An input signal in the form of locking signal generated by a locking signal source 11, is fed in port A, of the circulator 10 where the energy is circulated in a counterclockwise sense and leaves by port B. An electronic oscillator 12 which may be one port microwave oscillator of the reflex klystron type is connected to port B of the circulator 10. If synchronization criteria are met the output frequency of oscillator 12 will be of the same frequency and related in phase to the locking signal from source 11. The oscillator output enters port B and circulates to port C which is the output port and hence to a utilization circuit 13. Any reflected signal in the output line will be circulated to port D and absorbed by a matched load 14. A three port circulator with built in termination may also be used. Because of the nonreciprocal property of the circulator 10 the one port oscillator 12 has been turned into a two port device with some 40 db of isolation between input and output.

The condition for synchronization can be shown to be $$|2Q(\Delta f_0/f_0)(P/P_1)^{1/2}|<1 \qquad (1)$$

where P is the oscillator power $P_1$ is the power of the injected signal
$\Delta f_0=f_0-f_1$
$f_0$ is the free-running oscillator frequency
$f_1$ is the frequency of the injected signal
Q is the figure of merit of the oscillator circuit Synchronization has been verified experimentally for ratios of $P/P_1$ up to 70 db.

Figure 2:
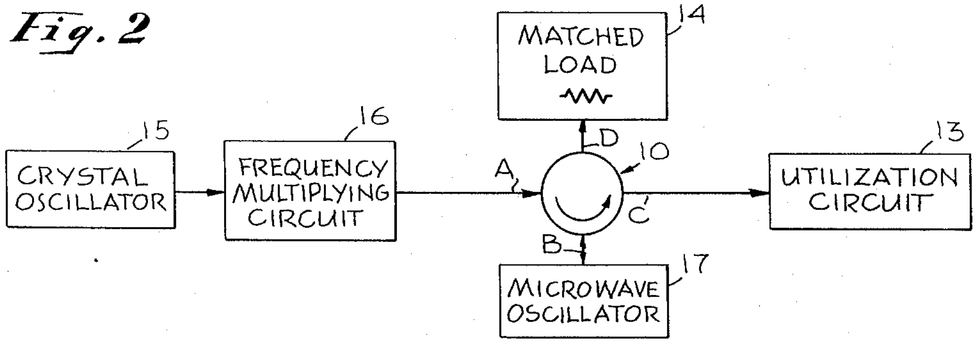
FIG. 2 illustrates a crystal controlled microwave source using a circulator.

If the phase of the locking signal is varied, the phase of the oscillator output will vary accordingly. In other words, the locked oscillator may be used to amplify signals that are modulated in frequency and phase, provided that the frequency deviation is within the locking range and the modulation rate is within certain limits imposed by the Q of the oscillator circuit. The disclosed technique is doubly important due to the improved oscillator frequency stabilization and the amplification of appropriately modulated signals. Frequency stabilization is illustrated by referring now to FIG. 2 where there is shown a conventional crystal oscillator 15 capable of generating for example a 5 mc. signal. The crystal oscillator output signal is multiplied to the microwave frequencies by a frequency multiplying circuit 16 using known techniques. In one embodiment the 5 mc. is multipled by 23 to 115 mc. in a conventional transistor multiplier chain. The power level being raised by conventional amplifier means and applied to a varactor harmonic multiplier for selecting the 80th harmonic at 9,200 mc. The multiplied signal is typically low in power, but may be used as the locking signal to stabilize a microwave oscillator 17 of inadequate stability that is connected to port B of the circulator 10. This may be looked upon as amplification of a C.W. signal and is a very practical technique for stabilization of pump sources for parametric amplification. Microwave oscillators need not be electron tube devices and the term is meant to include solid state devices such as transistor oscillators or tunnel diode oscillators. An all solid state parametric pump is a very desirable circuit component. Tunnel diode oscillators are now appearing in the microwave frequencies, but their stability is inadequate for pump use. Injection locking will provide the necessary stabilization.

The amplification of modulated signals that are of the constant amplitude variety for example, phase and frequency modulation, has been demonstrated to amplify locking signals modulated in phase by a sine wave at modulation rates up 500 kc.

Figure 3:
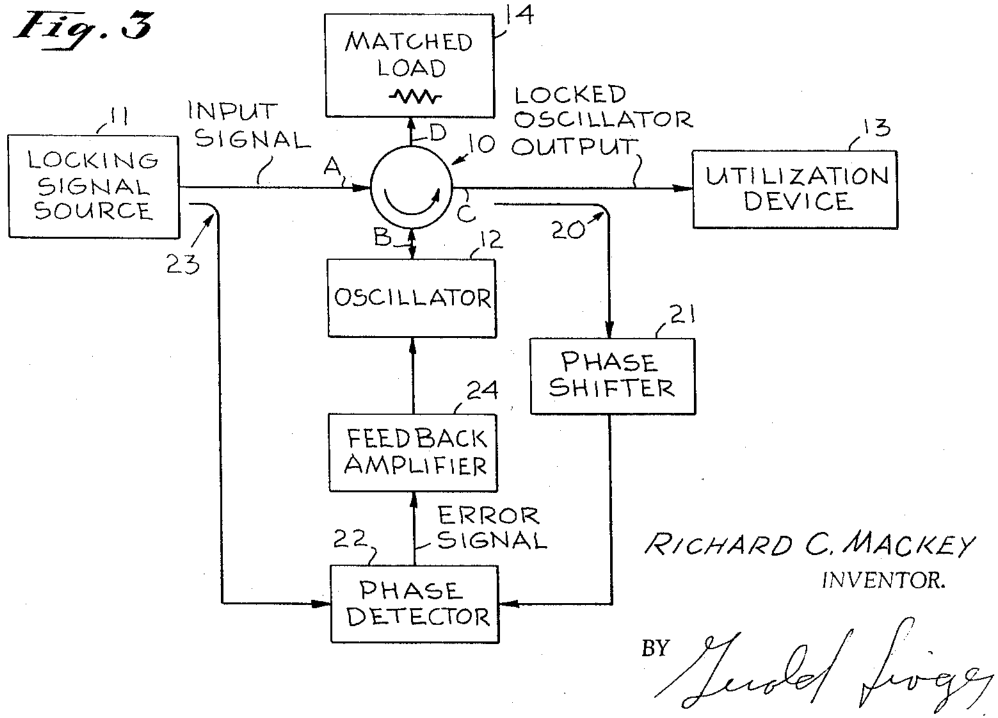
FIG. 3 illustrates an external control loop in an oscillator circulator combination for improving synchronization.

Referring now to FIG. 3 there is shown a system for improving the locking characteristics between the oscillator 12 and the locking signal source 11. In order to lessen the sensitivity of the locked oscillator to relative frequency drifts between the oscillator and the injection signal an external feedback loop is used. A portion of the output signal from port C is detected by a directional coupler 20 and fed through a phase shifter 21 to a phase detector 22. A portion of the locking signal is similarly detected by a directional coupler 23 which feeds the phase detector 22 which compares the input signal feeding port A with the output signal from port C. The phase shifter 21 which may be in either line permits proper adjustment of the relative phase so that a discriminator type S curve of the D.C. output voltage is obtained. The error signal is applied to a frequency sensitive electrode of the oscillator 12 after appropriate amplification in amplifier 24. The control loop need not be particularly tight or wideband as the principal phase lock is obtained by the RF injection into the oscillator cavity. The external loop serves to keep the oscillator-amplifier well within the locking range of the input signal. The tighter the external loop, the higher the value of injection gain that may be used with confidence to insure that unlocking will not occur.

Figure 4:
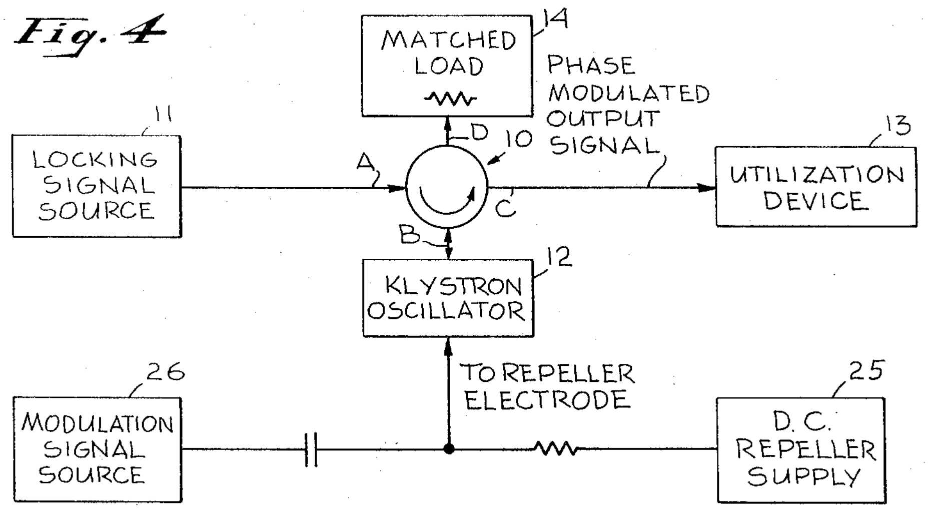
FIG. 4 illustrates an injection locked phase modulator using an oscillator circulator combination.

Referring now to FIG. 4 there is shown a new type of phase modulator based on the injection locking primarily. The system described utilizes a klystron oscillator 12 but the technique is not limited to the microwave region of the frequency spectrum. The klystron 12 is conventionally controlled by a D.C. voltage applied to the repeller electrode of the klystron and which is generated by a D.C. repeller supply 25. The frequency of most oscillators is somewhat dependent on the voltages applied to various parts of the oscillator circuit and heretofore many techniques have been devised to overcome this effect. The injection locked phase modulator makes use of the voltage tuning effect which may be inherent or induced by inclusion of a voltage variable capacitor, or other device. The repeller D.C. voltage is modulated by a modulation signal source 26 which may, for example, be A.C. coupled to the repeller electrode on the oscillator 12.

The repeller voltage modulation ordinarily results in a free running frequency deviation (FM), of the oscillator 12 but with the oscillator locked to the injected signal from source 11, the result is a change of phase of the oscillator output. The phase modulation is, of course, limited to less than ±90° or synchronization will be lost; ±30° is readily obtainable. The phase deviation is related to the system parameters by $$\theta=\sin^{-1}[2Q(\Delta f_0/f_0)(P/P_1)^{1/2}] \quad (2)$$

where

P is the oscillator power
$P_1$ is the injected power
$\Delta f_0=f_0-f_1$
$f_0$=free-running frequency
$f_1$ is the injected frequency
Q is the figure of merit of oscillator circuit For fixed operating conditions $$\theta=\sin^{-1} K\Delta f_0 \quad (3)$$

where $$K=(2Q/f_0)(P/P_1)^{1/2}$$

For a reflex klystron the free-running frequency deviation and repeller modulation are essentially linearly related for small deviations (<0.3% of oscillator frequency); i.e., α=oscillator frequency sensitivity constant in cycles/volt
$\Delta f_0=\alpha e_m$
$e_m$=modulation voltage amplitude Substitution gives $\theta=\sin^{-1}(K\alpha e_m)$.

Examination of the sine function shows that excellent linearity is obtained for $\theta<\pm30°$. Thus, for phase deviations less than 30° there is a linear relationship between phase shift and modulation voltage amplitude. For greater deviations equalization could be made in either receiver or transmitter.

Again, subject to a deviation of $\theta\leqq\pm30°$, the upper useful modulation frequency (corresponding to half power frequency concept) is given approximately by $$f_{m_{max}}=(f_0/2Q)(P_1/P)^{1/2} \text{ cycles/sec.}$$

Example for an X-band klystron with typical values of $f_0=10^{10}$, $Q=100$, $P_{1/P}=0.001$ (30 db injection ratio):

$$f_m=10^{10}/2(100)(31.6)=1.5 \text{ mc.}$$

Figure 5:
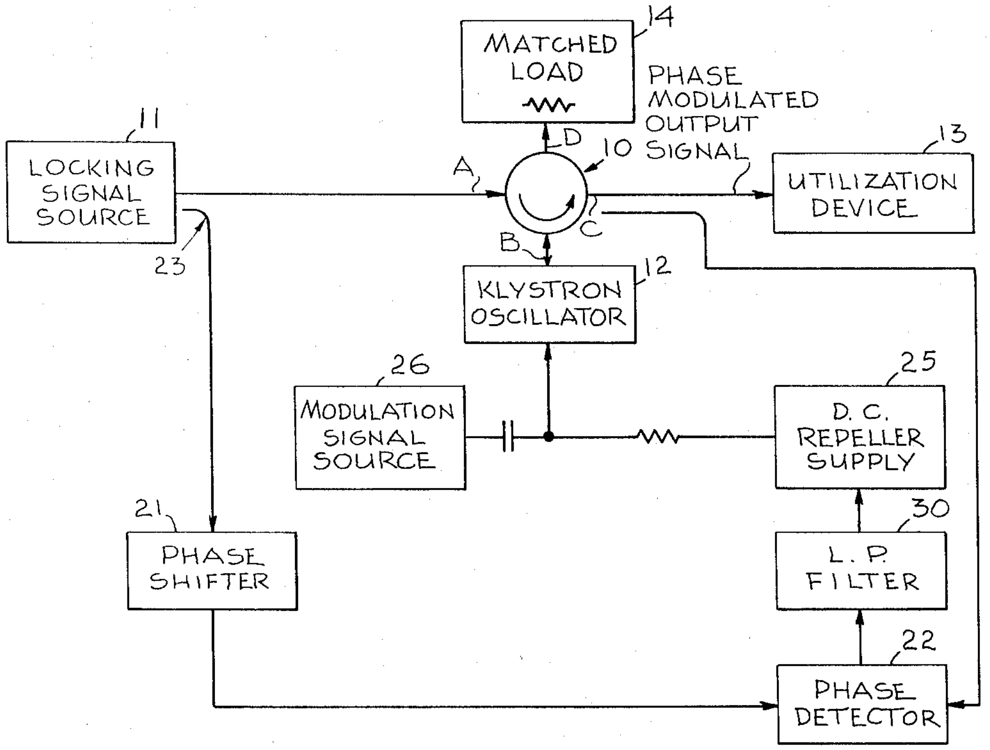
FIG. 5 illustrates an external control loop for an injection locked phase modulator using an oscillator circulator combination.

Referring now to FIG. 5, there is shown a system with improved stability by incorporating feedback around the modulated oscillator 12. Drifts in the klystron voltages, or thermal drifts, may cause the modulator to drift out of synchronization. The stability of the system is improved by placing the feedback around the modulated oscillator as shown. A portion of the synchronizing input signal and the modulated output signal are compared in a phase detector 22. The phase detector output is set to zero by the phase shifter 21, with the modulation input disabled. With the modulation signal applied, the phase detector output will contain components from the phase modulation and from the slower voltage or thermal drifts. A low pass filter 30 driven by the output of the phase detector 22 rejects the modulation components and the drift output which is fed back to the repeller power supply 25 in the phase required to result in a correction of the drift.

Figure 6:
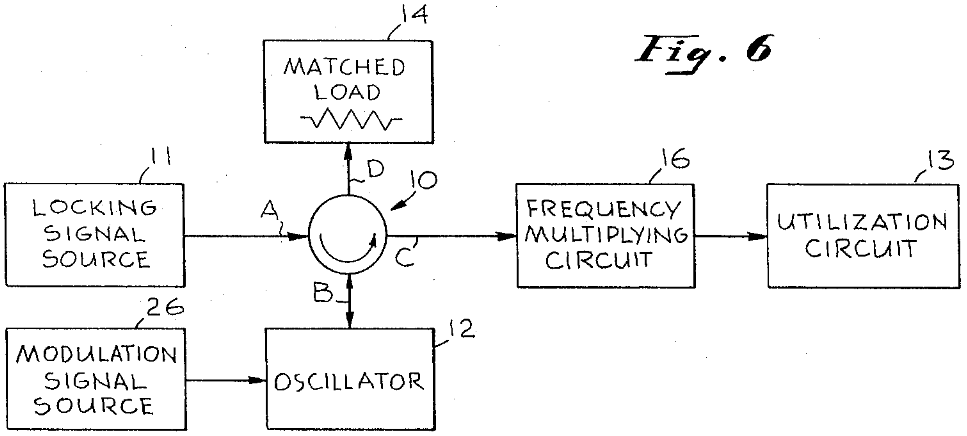
FIG. 6 illustrates the basic oscillator circulator combination for obtaining an output phase shift greater than 30°.

Referring now to FIG. 6 there is shown the basic modulation circuit illustrated in FIG. 4 which includes a frequency multiplying circuit 16 being fed from port C of the circulator 10. The output of the frequency multiplying circuit 16 feeds the utilization circuit 13 at the higher frequency determined by the frequency multiplying characteristics of the frequency multiplying circuit 16 together with a greater phase shift capability resulting from the same multiplying factor. As demonstrated previously in connection with FIG. 4, the frequency of the locking signal source 11 will be the same as the frequency of the oscillator 12 and hence a modulating signal from the modulation signal source 26 will change only the phase of the signal generated by the oscillator 12 and not the frequency. This circuit is to be compared with that illustrated in FIG. 2 in which the frequency multiplying circuit 16 is in circuit with the crystal oscillator 15 feeding port A of the circulator 10. In that illustration, the output signal from port C is limited to a phase shift of approximately ±30° as previously demonstrated. Since the purpose of the frequency multiplying circuit was used to make a crystal control oscillator signal available in the microwave region.

Figure 7:
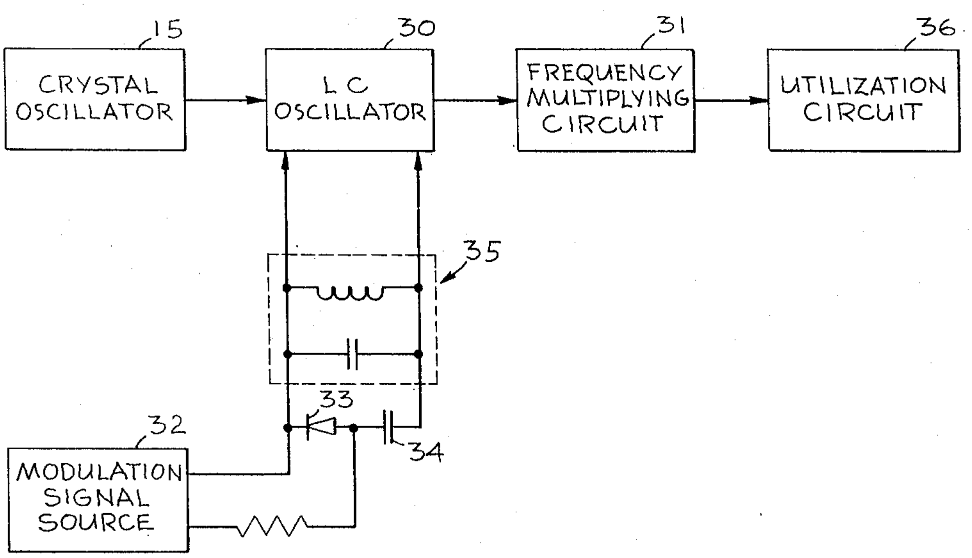
FIG. 7 illustrates a substantially low frequency arrangement for obtaining a large output phase shift.

Referring now to FIG. 7, there is shown another embodiment of a substantially lower frequency locking circuit having a substantially high phase shift characteristic in the output signal. In FIG. 7, a crystal oscillator 15 is conventionally coupled to an LC oscillator 30 the output of which feeds a frequency multiplying circuit 31. The LC oscillator 30 is modulated by a modulation signal source 32 which is shown connected to a varicap 33 and capacitor 34 connected in the tank circuit 35 of the LC oscillator 30. A changing voltage from the modulation signal source 32 has the effect of generating a varying voltage across terminals of the varicap 33 which responsively changes capacitance as the voltage varies. Normally the frequency of the output LC oscillator 30 would vary however since the LC oscillator is frequency locked to the crystal oscillator 15 only the phase of the output frequency signal from the LC oscillator will vary. The output signal from the LC oscillator 30 is not useful by itself within the phase shift limitations previously described, however, by feeding the signal to the frequency multiplier 31, which in turn feeds a utilization circuit 36 it is possible to obtain a higher phase deviation increased by the multplication ratio as previously described in connection with FIG. 6.

This completes the description of the embodiment of the invention illustrated herein. However, many modifications and advantages thereof will be apparent to persons skilled in the art without departing from the spirit and scope of this invention. Accordingly, it is desired that this invention not be limited to the particular details of the embodiment disclosed herein, except as defined by the appended claims.

The embodiments of the invention in which an exclusive property or privilege is claimed are defined as follows:

1. In combination,
- a circulator having a plurality of ports identified serially in the direction of energy propagation within said circulator,
- means for generating a reference signal and directing said signal into a first port,
- an oscillator for generating an output signal, means for directing said oscillator output signal into a second port,
- a utilization circuit connected to a third port for receiving said oscillator generated signal at said reference signal frequency,
- detecting means for phase detecting a portion of said reference signal feeding said first port with a portion of said output signal at said third port, and
- means responsive to said detecting means externally controlling the frequency of said oscillator.

2. In combination,
- a circulator having at least a first port, a second port and a third port identified serially in the direction of energy propagation within said circulator,
- a reference signal source connected to said first port,
- a klystron oscillator generating an output signal and adapted to be controlled by a repeller voltage source, said klystron oscillator output connected to said second port,
- a utilizing circuit connected to said third port for receiving said klystron oscillator generated signal at said reference signal frequency,
- detecting means for phase detecting a portion of said reference signal feeding said first port with a portion output signal at said third port,
- means responsive to said detecting means for controlling said repeller voltage to thereby control said klystyron oscillator frequency, and
- means for modulating said repeller voltage to thereby modulate said output signal at said third port.

3. A combination according to claim 2 in which the output signal is phase modulated.

4. In combination:
- a free running oscillator for generating a source of energy,
- a substantially fixed frequency reference oscillator coupled to said free running oscillator whereby said source of energy is frequency locked to the frequency of said reference oscillator,
- and means connected to said free running oscillator for modulating said energy generated by said free running oscillator whereby said energy is phase modulated.

5. A combination according to claim 4 which includes means for frequency multiplying said energy whereby a greater phase variation is obtained.

6. In combination,
- a circulator having a plurality of ports identified serially in the direction of energy propagation within said circulator,
- means for generating a reference signal and directing said signal into a first port,
- a free running klystron oscillator for generating an output signal into a second port, means for phase modulating said oscillator generated output signal, and
- a frequency multiplying circuit connected to a third port of said circulator for multiplying said modulator output signal to obtain a greater phase variation in said output signal.

References Cited by the Examiner

UNITED STATES PATENTS

| | | | |
|---|---|---|---|
| 2,710,923 | 6/1955 | Chang et al. | 331—55 X |
| 2,738,422 | 3/1956 | Koros | 331—172 X |
| 3,003,118 | 10/1961 | Kline | 331—55 |
| 3,127,572 | 3/1964 | McLeod | 331—87 X |

OTHER REFERENCES

Marks, "Cascade Phase Shift Modulator," a reprint from the December 1946 issue of Electronics.

Silverman, "Voltage Variable Capacitors," CQ February 1961, pp. 40–41.

ROY LAKE, *Primary Examiner.*

J. B. MULLINS, *Assistant Examiner.*